United States Patent [19]
Lee et al.

[11] Patent Number: 5,787,399
[45] Date of Patent: Jul. 28, 1998

[54] PORTABLE RECORDING/REPRODUCING DEVICE, IC MEMORY CARD RECORDING FORMAT, AND RECORDING/ REPRODUCING MEHTOD

[75] Inventors: Young-man Lee, Suwon; Chan-dong Cho, Ansan, both of Rep. of Korea

[73] Assignee: Samsung Electronics Co., Ltd., Kyungki-Do, Rep. of Korea

[21] Appl. No.: 902,204

[22] Filed: Jul. 29, 1997

Related U.S. Application Data

[63] Continuation of Ser. No. 381,654, Jan. 31, 1995.

[30] Foreign Application Priority Data

May 31, 1994 [KR] Rep. of Korea ............... 1994 12148

[51] Int. Cl.⁶ ........................................... G10L 3/00
[52] U.S. Cl. ..................... 704/270; 704/201; 704/215
[58] Field of Search ...................... 395/2.76, 2.1, 395/2.79–2.84, 2.87, 2.24; 364/514 A; 704/201, 267, 215, 270–275, 278

[56] References Cited

U.S. PATENT DOCUMENTS

| | | | |
|---|---|---|---|
| 4,384,169 | 5/1983 | Mozer et al. | 178/1 SM |
| 5,056,145 | 10/1991 | Yamamoto et al. | 381/51 |
| 5,357,595 | 10/1994 | Sudoh et al. | 395/2.24 |
| 5,359,698 | 10/1994 | Goldberg et al. | 395/2.1 |
| 5,481,645 | 1/1996 | Bertino et al. | 395/2.79 |
| 5,491,481 | 2/1996 | Akagiri | 341/87 |
| 5,499,316 | 3/1996 | Sudoh et al. | 395/2.79 |
| 5,526,407 | 6/1996 | Russell et al. | 395/2.79 |

FOREIGN PATENT DOCUMENTS

4207447 A 9/1993 Germany ............... 395/2.81

Primary Examiner—David D. Knepper
Attorney, Agent, or Firm—Sughrue, Mion, Zinn, Macpeak & Seas, PLLC

[57] ABSTRACT

Components include: an audio input, an audio output, a signal processor, a buffer memory, an interface, a command input, a display, and a controller. When a record command is input, the controller detects a non-sound section of the audio signal input, generates time data corresponding to the non-sound section, forms a data transmission block using the time data and sound data, records the result into an IC memory card, and registers a list of the newly recorded content at a content table. When a reproduction command is input, the controller reads the start/end address of a selected musical piece with reference to the TOC which is loaded into the buffer memory from the IC memory card, accesses the corresponding audio data from the IC memory card, and controls the system according to a reproduction operation. Silence sections are only stored at the beginning of a musical piece.

7 Claims, 4 Drawing Sheets

5,787,399

1

PORTABLE RECORDING/REPRODUCING DEVICE, IC MEMORY CARD RECORDING FORMAT, AND RECORDING/ REPRODUCING MEHTOD

This is a Continuation of Application No. 08/381,654 filed Jan. 31, 1995.

BACKGROUND OF THE INVENTION

The present invention relates to a portable recording/reproducing device and IC memory record format and a recording/reproducing method using an IC memory card as the recording medium, and more particularly, to a more compact portable recording/reproducing device which uses the IC (integrated circuit) memory card as a music recording medium.

A portable recording/reproducing device comprises a deck mechanism for recording and reproducing data onto a magnetic tape or a disk. Thus, certain restrictions are encountered when attempting to design a portable recording/reproducing device which is lightweight and thin and has a miniaturized and simplified structure. Additional design considerations include power supply and consumption. Generally batteries are used as the power source and power consumption should be kept at a minimum. Unless great attention is given to the handling and care of the recording medium, the recording medium (possibly containing important information) may be damaged, or data integrity may deteriorate over a period of time.

Recently, memory devices have acquired large capacities due to the development of semiconductor manufacturing techniques. Furthermore, such memories, which can be electronically read and written, have become commercially available in the form of an IC memory card. Accordingly, many electronic products employing memory cards are currently being introduced.

EP Patent No. 294201 discloses a digital sound data storing device that uses an IC memory card. The disclosure describes a device in which sound data (in units of spoken sentences for use in language study) is recorded onto an IC memory card. The recorded sound data is read from the IC card and synthesized and amplified for output via a speaker. Here, initial address information of each sentence group is recorded in a record format, in accordance with the sequence of the sentence groups (sequence number). Then, the data of each sentence group is sequentially recorded according to the sequence number of the sentence groups, from the corresponding initial address to a point immediately preceding the initial address of the next sentence group. Accordingly, when the sentence group sequence number is input, the corresponding initial address is read out and the data of the corresponding sentence group is read, starting from the read-out initial address. The sentence group data is then audio-synthesized and output as a sound signal.

SUMMARY OF THE INVENTION

Accordingly, it is an object of the present invention to provide a portable recording/reproducing device that employs an IC memory card as a recording medium and to provide a recording and reproducing method thereof.

It is another object of the present invention to provide a music record format for use with an IC memory card.

To accomplish the above first object of the present invention, there is provided a portable recording/reproducing device comprising, in a single case: audio input means for inputting an analog audio signal via an external microphone input terminal and generating a digital audio signal; audio output means for converting the digital audio signal into an analog audio signal and outputting the result to an external earphone output terminal; a signal processor for compressing the digital audio signal input via the audio input means and expanding the compressed data so as to provide a digital audio signal to the audio output means; a buffer memory for storing a table of contents (TOC) and temporarily storing the data processed by the signal processor; interfacing means for performing an interfacing operation with respect to the transmission of recording/reproducing data between the signal processor and an IC memory card; input means for inputting recording and reproducing commands; a display for displaying system operation state; and a controller for, when a record command is input via the control input means, detecting a non-sound section of the audio signal input via the audio input means and generating time data corresponding to the non-sound section, forming a data transmission block using the time data and sound data, recording the result onto the IC memory card via the interfacing means, and registering entry of the newly recorded content at a content table, and when a reproduction command is input via the control input means, reading the start/end address of a selected musical piece with reference to the TOC which is loaded into the buffer memory from the IC memory card via the interfacing means, accessing the corresponding music data of the IC memory card, controlling the system according to a reproduction operation, and displaying the control state via the display.

The record format of an IC memory card employed as a recording medium of the portable recording/reproducing device of the present invention, is constituted by a table of contents (TOC) area where the attribute and TOC of the IC memory card are stored and a data area where a plurality of recorded programs corresponding to the TOC are stored.

A recording method of the portable recording/reproducing device that employs an IC memory card as a recording medium, comprises the steps of: determining whether the IC memory card is inserted and reading the data of a table of contents (TOC) area when the IC memory card is inserted; generating a pointer and storing the start address of a new recording program when record command is input; converting the input analog audio data into a digital signal, compressing a plurality of sample values by frame units, forming a transmission block by a plurality of frames whose first data is the non-sound time data, and storing the data in a memory address of the IC memory card which is defined from the start address by transmission block units; determining whether recording ends and storing the end address of a recorded program when the recording ends; and registering the stored start address and end address in a TOC location defined by the pointer and updating the TOC of the IC memory card.

A reproducing method of the portable recording/reproducing device that employs an IC memory card as a recording medium, comprising the steps of: determining whether the IC memory card is inserted and reading the data of a table of contents (TOC) area when the IC memory card is inserted; receiving a reproduction command and a user-entered number corresponding to a selected recording program; reading start and end addresses denoted by a pointer value that corresponds to the user-entered selection number with reference to the TOC; accessing the data area of the IC memory card between the start and end addresses, expanding the accessed audio data, reading non-sound time data, maintaining the non-sound section for the corresponding time period and outputting an analog audio signal; and determining when the end address has been reached and stopping the reproduction operation upon reaching the end address.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

The present invention will be explained in more detail with reference to the attached drawings.

Figure 1:
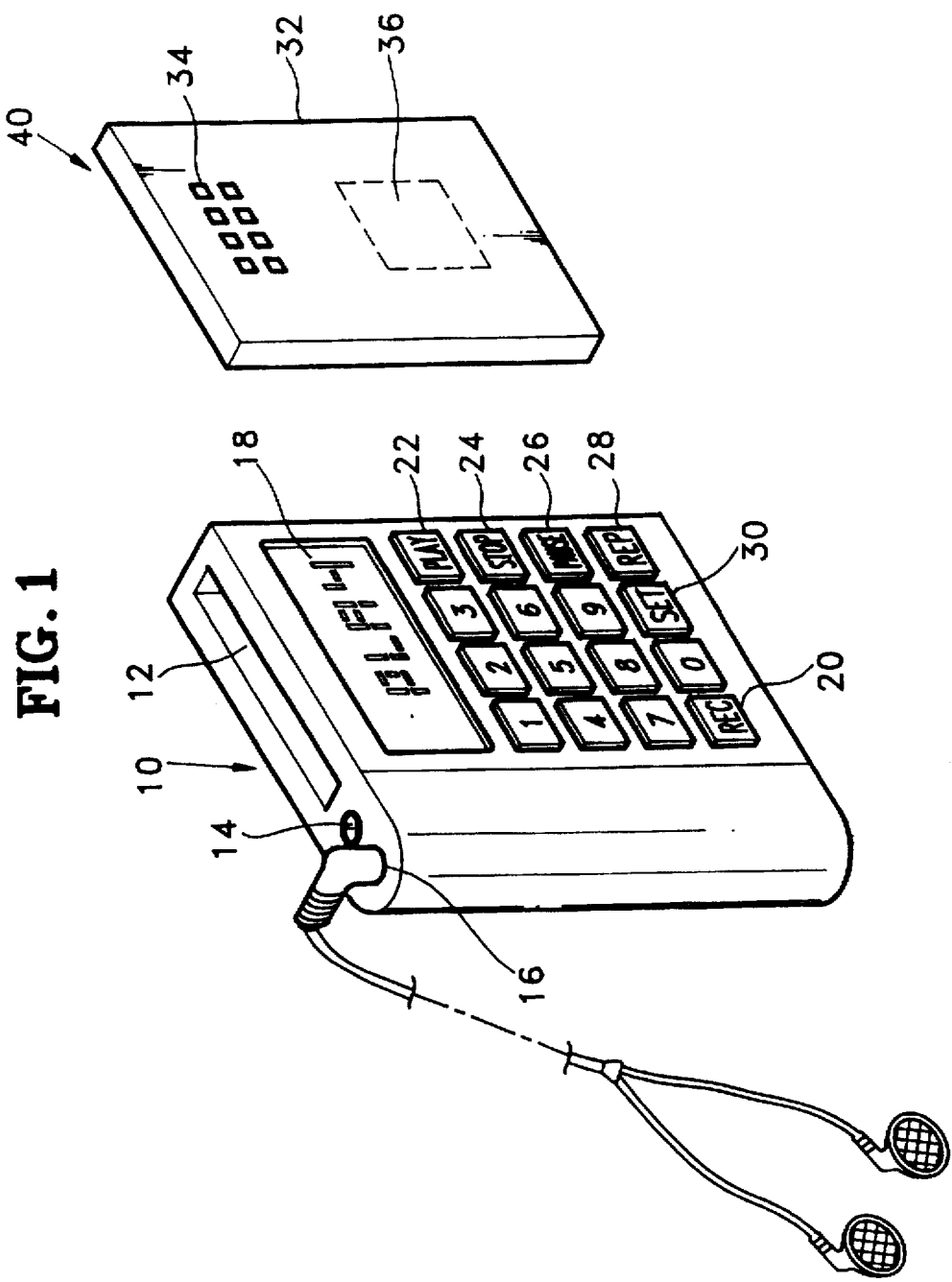
FIG. 1 is an outer perspective view of a portable recording/reproducing device that employs an IC memory card of the present invention.

Referring to FIG. 1, a portable recording/reproducing device of the present invention includes an IC memory card insertion slot 12, an external microphone input terminal 14 and an external earphone output terminal 16 which are provided in the upper surface of a case 10. In the upper front surface of case 10, a liquid display 18 for displaying the system operation state is installed, and numerical keys and function keys are disposed below liquid display 18. The numerical keys are for inputting selections of a recorded program or a chapter according to a corresponding number. In the embodiment of the present invention, the function keys include a record (REC) key 20, a play key 22, a stop key 24, a pause key 26, a repeat (REP) key 28 and a set key 30. An IC memory card 40 for insertion into the case includes a semiconductor memory chip 36 provided in a plastic molding case 32 having an external input terminal 34.

Figure 2:
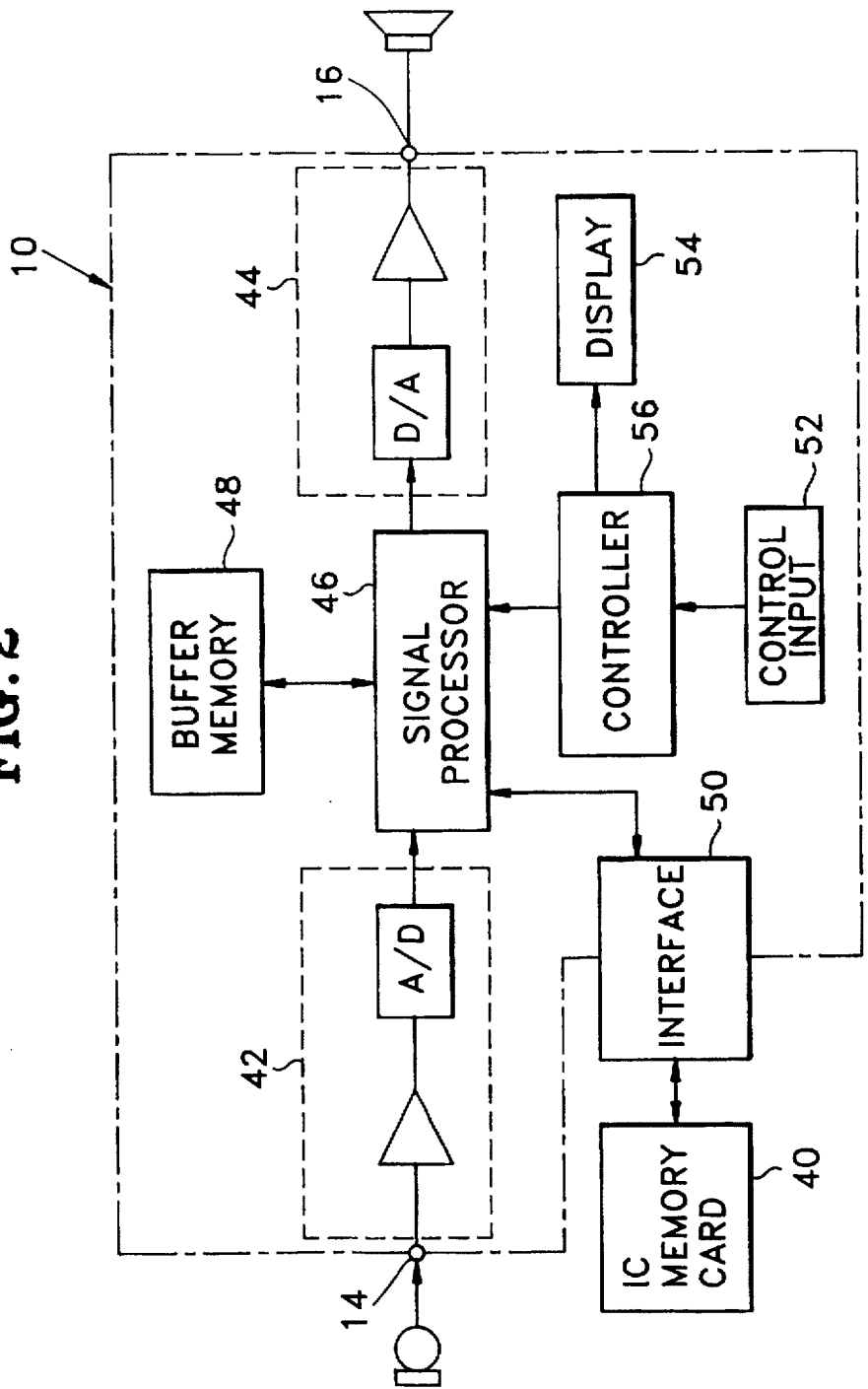
FIG. 2 is a block diagram of a portable recording/ reproducing device that employs an IC memory card of the present invention as a recording medium.

Referring to FIG. 2, a portable recording/reproducing device of the present invention includes, in a single case 10, audio input means 42 comprising an input amplifier for inputting an analog audio signal via external microphone input terminal 14 and an analog-digital converter for converting the input analog audio signal into a digital audio signal, audio output means 44 comprising a digital-analog converter for converting the digital audio signal into an analog audio signal and an output amplifier for outputting the audio signal to external earphone output terminal 16, a signal processor 46 for compressing the digital audio signal provided via audio input means 42, expanding the compressed data and providing the digital audio signal to audio output means 44, a buffer memory 48 for storing a table of contents (TOC) and temporarily storing the data processed by the signal processor, interfacing means 50 for performing an interface operation with respect to the transmission of the recording or reproducing data between IC memory card 40 and signal processor 46, control input means 52 comprising the above-mentioned numerical keys and function keys and which inputs a recording/reproducing command according to the key input, a display 54 for displaying the operational state of the system, and a controller 56 for, when a record command is input via control input means 52, detecting a non-sound section of the audio signal input via audio input means 42, generating time data corresponding to the non-sound section, forming a data transmission block using the time data and sound data, recording the result onto IC memory card 40 via interfacing means 50, and registering entry of the newly recorded content at a content table, and when a reproduction command is input via control input means 52, reading the start/end address of a selected musical piece with reference to the TOC which is loaded onto buffer memory 48 from IC memory card 40 via interfacing means 50, accessing the corresponding music data of IC memory card 40, controlling the system according to a reproduction operation, and displaying the control state via display 54.

Figure 3:
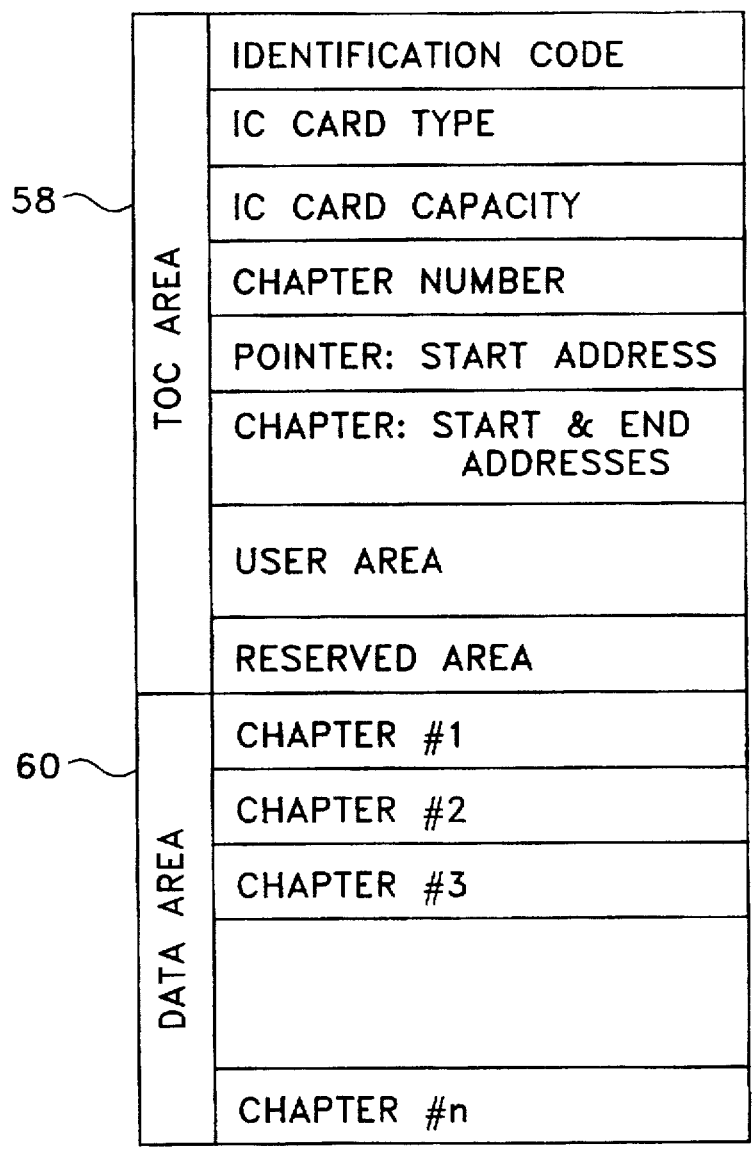
FIG. 3 illustrates a record format of the IC memory card of the present invention.

Referring to FIG. 3, a record format of IC memory card of the present invention is constituted by a table of contents (TOC) area 58 for storing the attributes and TOC of IC memory card 40 and occupying 4K bytes, and a data area 60 for storing plurality of recorded programs corresponding to TOC and occupying the remaining area. TOC area 58 has ten bytes of an ASCII identification code, i.e., data confirming whether the currently inserted memory card has a correct format. In other words, the identification code determines whether the card was recorded by the recording/reproducing device of the present invention or is being used for the first time (unformatted). If an unformatted card is inserted, the system formats the inserted card. Then, memory card type information (1-byte) indicates whether the memory is a masked ROM, a DRAM, an SRAM or a flash memory. Also, card capacity information (3-bytes) indicates memory capacity; in other words, the duration of the recording medium can be known by the capacity. Further, the number of 1-byte chapters indicates the number of currently recorded programs, with the maximum number being 128. Here, a chapter is the unit of recording, i.e., from the pressing of record key 20 to start recording to the pressing of stop key 24 to stop the recording, and at maximum 128 recording operations are possible. Since a pointer is generated for each chapter, the maximum number of pointers is also 128. In addition, the pointer includes initial address information denoting the storage location of the start and end address information of each chapter. The start and end address information of a chapter occupies 128x6 bytes. Next, a user area occupies 128x15 bytes of memory where year/month/date and title information are stored when recording is performed for each chapter. The remainder of the 4K-byte TOC area 58 is a reserved area.

Figure 4:
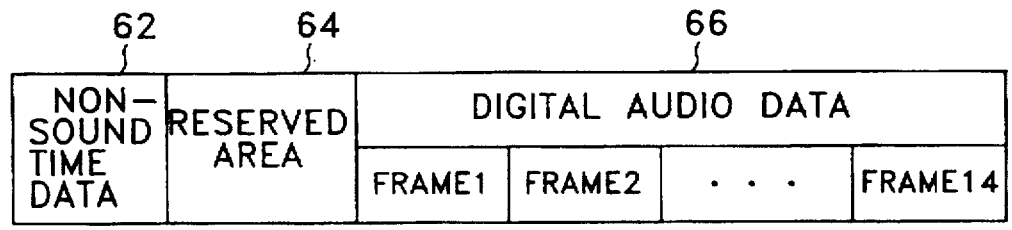
FIG. 4 illustrates a block structure of the transmission data between the portable recording/reproducing device and the IC memory card of the present invention.

Referring to FIG. 4, the data is recorded in data area 60 by chapter units, and the data constituting each chapter includes 1-byte of non-sound time data 62, 3-bytes of a reserved area 64 and 14-frames of digital audio data 66. Non-sound time data 62 corresponds to sections having no audio signal recorded and coincides with a time (number of blocks) which is represented by block-unit codes. For example, if a non-sound condition continues for four blocks and each block is twenty milliseconds in length, the non-sound period lasts for 80 milliseconds. Therefore, the hexadecimal number "00" indicates the sound section, and if non sound time data has a value, the non-sound section continues for an equivalent period. Thus, if the number is "00," a decoding operation is performed immediately, and if the number is not "00," the decoding pauses for the duration of the non-sound time data. At the point where the non-sound interval is completed, the decoding starts again. Each frame is constituted by 17-byte compressed data. The 17-byte compressed data is compressed by a code-excited linear prediction (CELP) algorithm by having 160 samples of the audio signal as a processing unit.

The recording/reproducing operation of the present invention is performed as follows.

Figure 5:
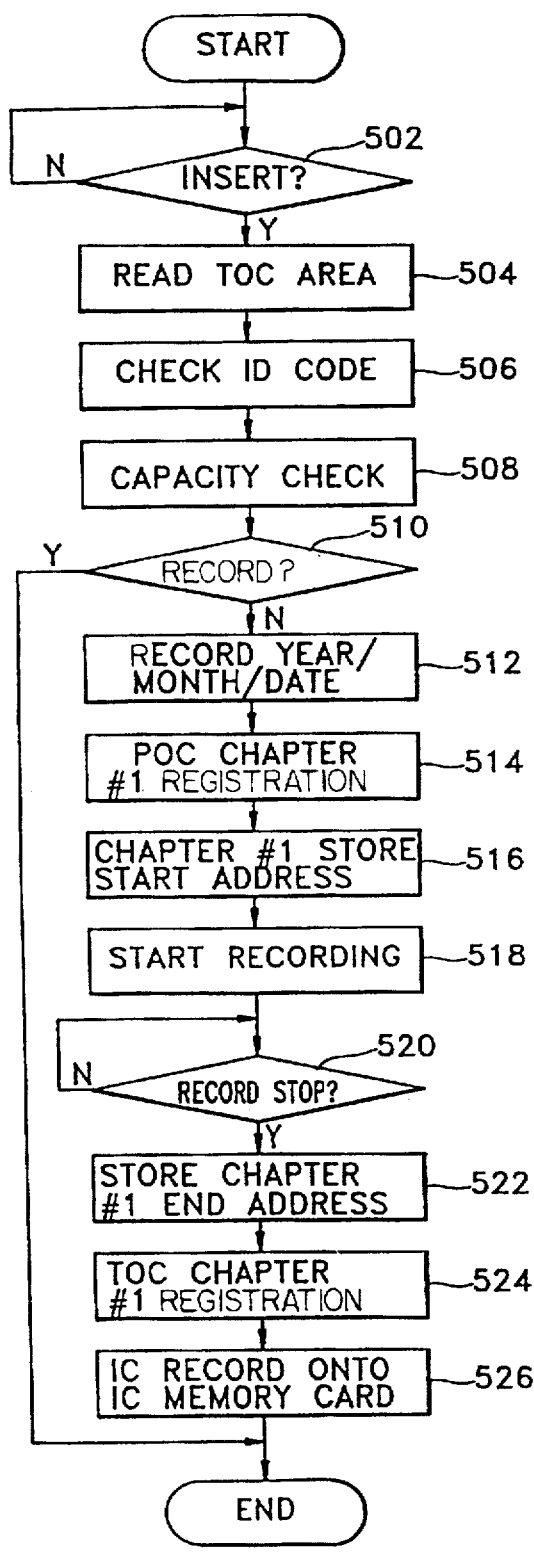
FIG. 5 is a flowchart illustrating a recording method of the portable recording/reproducing device of the present invention.

Referring to FIG. 5, in a recording method of a portable recording/reproducing device, the insertion of IC memory card 40 is determined (step 502), and the data in TOC area 58 is read upon insertion of IC memory card 40 (step 504). The identification (ID) code is checked among the read data (step 506), and formatting is performed if the ID code indicates that the card is being used for the first time, and if the format is right, card capacity is checked (step 508).

When record key 20 is pressed (step 510), the recording year/month/date is recorded (step 512). Then, the currently set (last) pointer value is increased by one to thereby generate a new pointer (step 514), and the end address value of the last recorded chapter plus one is stored as the start address of the new recording program (step 516).

The analog audio data input via a microphone is converted into digital audio data, 160 samples are compressed by frame units, and a transmission block is formed by fourteen frames of which first data is non-sound time data. Then, the compressed data is stored in a memory address of the IC memory card denoted by the start address, in transmission block units (step 518).

The end of recording is determined (step 520), whereupon the end address of the recorded program is stored (step 522). Then, the stored start address and end address are registered in a TOC location defined by the pointer (step 524), and the TOC of the IC memory card is updated (step 526) and the process ends.

Figure 6:
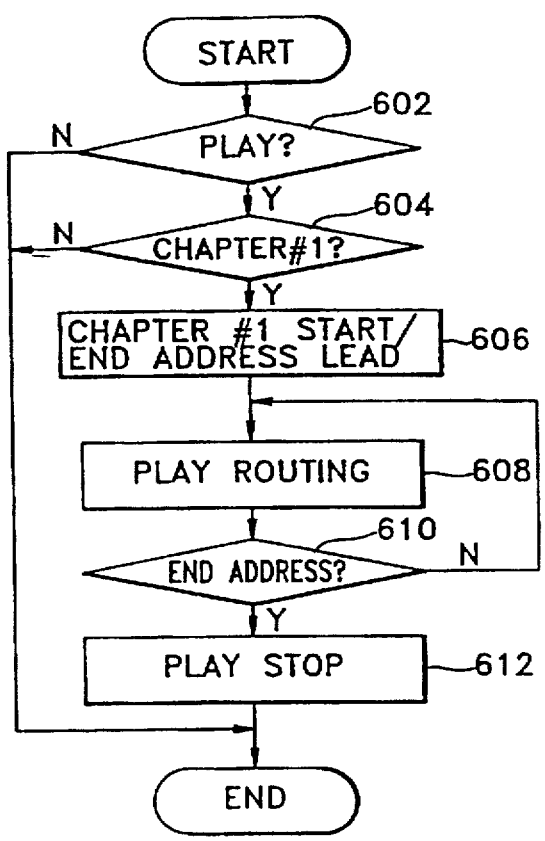
FIG. 6 is a flowchart illustrating a reproducing method of the portable recording/reproducing device of the present invention.

Referring to FIG. 6, the playback method of the present invention is as follows.

A play key is input (step 602) and a numerical key is pressed to select a musical piece (step 604). Then, start and end addresses defined by the pointer value corresponding to the number of the selected recorded program are read with reference to the TOC (step 606), and data accessing is performed by the read start address so as to perform the play operation (step 608). Accessing of the data area of the IC memory card between the start address and end address is performed, and the accessed audio data is expanded and the non-sound time data is read. Thus, the non-sound section is maintained during the corresponding time period and then an analog audio signal is output. It is determined when the end address has been reached (step 610), whereupon the play operation is stopped (step 612).

As described above, an IC memory card is employed as a recording medium in the present invention. Thus, a recording/reproducing device can be lightweight, ultra-slim and miniaturized without having a complicated deck mechanism, as compared with recording/reproducing devices which employ a tape or disk as the recording medium. Therefore, the recording/reproducing device of the present invention is convenient to carry (portable) and has an improved search/access speed.

What is claimed is:

1. A portable recording/reproducing device contained in a single case, comprising:
   audio input means for inputting an analog audio signal via an external microphone input terminal and generating a digital audio signal;
   a signal processor for compressing the digital audio signal input via said audio input means and expanding compressed data so as to provide a processed digital audio signal;
   audio output means for converting the processed digital audio signal into a second analog audio signal and outputting the result to an external earphone output terminal;
   a buffer memory for storing a table of contents (TOC) and temporarily storing data processed by said signal processor;
   interfacing means for performing an interfacing operation with respect to the transmission of recording/reproducing data between the signal processor and an IC memory card;
   control input means for inputting recording and reproducing commands;
   a display for displaying a control state; and
   a controller for, when a record command is input via said control input means, detecting a non-sound section of the audio signal input via said audio input means and generating time data corresponding to a time of duration of the non-sound section, the time of duration being one of a plurality of possible times of duration of the non-sound section, forming a data transmission block having the time data and sound data, in which the time data constitutes a header of the data transmission block and indicates the time of duration of the non-sound section which occurs before an audio section corresponding to the sound data of the data transmission block, recording the result onto the IC memory card via said interfacing means, and registering entry of newly recorded content in the TOC, and when a reproduction command is input via said control input means, reading one of a start address and an end address of a selected audio piece with reference to the TOC which is loaded into said buffer memory from the IC memory card via said interfacing means, accessing corresponding audio data of the IC memory card and decoding the corresponding audio data after a time delay corresponding to the time duration of the non-sound section, controlling the system according to a reproduction operation, and displaying the control state via said display.

2. A record format of an IC memory card which is used as a recording medium of a portable recording/reproducing device, the record format comprising a table of contents (TOC) area where attributes and a TOC of the IC memory card are stored and a data area where a plurality of recorded programs corresponding to said TOC are stored, wherein said data area stores non-sound time data and sound data by transmission block units constituted by frames of compressed audio data, said non-sound time data indicating a time duration of a non-sound section of recorded data, the time duration being one of a plurality of possible time durations of the non-sound section, each of said transmission block units having one of the non-sound time data and sound data, in which said one of the non-sound time data constitutes a header of the data transmission block and indicates the time of duration of the non-sound section which occurs before an audio section corresponding to the sound data of the data transmission block.

3. A record format of IC memory card according to claim 2, wherein said TOC area comprises an identification code, the number of recorded programs, a pointer for the recorded programs and start and end address information of the recorded programs defined by said pointer.

4. A recording method of a portable recording/reproducing device that employs an IC memory card as a recording medium, comprising the steps of:

determining whether the IC memory card is inserted in the recording/reproducing device and reading data of a table of contents (TOC) area when the IC memory card is inserted in the device;

generating a pointer and storing a start address of a new recording program when a record command is input;

converting input analog audio data into a digital signal;

compressing a plurality of sample values by frame units to form digital audio data;

forming a transmission block by a plurality of frames, said transmission block having non-sound data as header data, said non-sound time data indicating a time duration of a non-sound section of recorded data, the time duration being one of a plurality of possible time durations of the non-sound section;

storing the digital audio data and the first data by transmission block units into a memory address of the IC memory card which is defined from said start address;

determining whether a recording ends and storing an end address of a recorded program when the recording ends; and registering said stored start address and said stored end address in a TOC location defined by said pointer and updating the TOC of the IC memory card.

5. A reproducing method of the portable recording/reproducing device that employs an IC memory card as a recording medium, comprising the steps of:

determining whether the IC memory card is inserted in the device and reading data of a table of contents (TOC) area when the IC memory card is inserted;

receiving a reproduction command and a user-entered number corresponding to a selected recording program;

reading start and end addresses denoted by a pointer value that corresponds to said user-entered selection number with reference to said TOC;

retrieving audio data from a data area of the IC memory card between said start and end addresses, said audio data being made up of at least one transmission block, each of said at least one transmission blocks having a plurality of frames and having non-sound data as header data;

expanding the retrieved audio data;

reading the non-sound time data from the expanded audio data;

maintaining a non-sound section for a time period corresponding to the non-sound time data, the time period being one of a plurality of possible time periods;

outputting an analog audio signal; and determining when said end address has been reached and stopping the reproduction operation upon reaching the end address.

6. A portable recording device contained in a single case, comprising:

audio input means for inputting an analog audio signal via an external microphone input terminal and generating a digital audio signal;

a signal processor for compressing the digital audio signal input via said audio input means and expanding the compressed data so as to provide a digital audio signal to said audio output means;

a buffer memory for storing a table of contents (TOC) and temporarily storing the data processed by said signal processor;

interfacing means for performing an interfacing operation with respect to the transmission of recording data between the signal processor and an IC memory card;

control input means for inputting recording commands;

a display for displaying a control state; and a controller for controlling a recording system to perform a recording portion and displaying the control state via said display by, when a record command is input via said control means, detecting a non-sound section of the audio signal input via said audio input means and generating time data corresponding to a time of duration of the non-sound section, the time of duration being one of a plurality of possible times of duration of the non-sound section, forming a data transmission block using the time data as a header and using sound data, recording the result onto the IC memory card via said interfacing means, and registering entry of the new recorded content in the TOC.

7. A portable reproducing device contained in a single case, comprising:

audio output means for converting a digital audio signal into an analog audio signal and outputting the result to an external earphone output terminal;

a signal processor for expanding the compressed data so as to provide a digital audio signal to said audio output means;

a buffer memory for storing a table of contents (TOC) and temporarily storing the data processed by said signal processor;

interfacing means for performing an interfacing operation with respect to the transmission of reproducing data between the signal processor and an IC memory card;

control input means for inputting reproducing commands;

a display for displaying a control state; and a controller for controlling a reproduction system to perform a reproduction operation and displaying the control state via said display by, when a reproduction command is input via said control input means, reading one of a start address and an end address of a selected musical piece with reference to the TOC which is loaded into said buffer memory from the IC memory card via said interfacing means, accessing the corresponding audio data of the IC memory card, wherein said audio data is constituted of at least one data transmission block using time data as a header and sound data, and decoding the corresponding audio data with a time delay corresponding to a time duration of a non-sound section of the audio signal indicated by the time data.

\* \* \* \* \*